United States Patent [19]
Schoepfer

[11] Patent Number: 5,856,809
[45] Date of Patent: Jan. 5, 1999

[54] STATIC ANTENNA TUNING AND ANTENNA VOLTAGE MEASUREMENT

[75] Inventor: Harald Schoepfer, Freising, Germany

[73] Assignee: Texas Intruments Incorporated, Dallas, Tex.

[21] Appl. No.: 787,197

[22] Filed: Jan. 22, 1997

[51] Int. Cl.[6] .............................. G01R 29/10; H01Q 1/50
[52] U.S. Cl. ...................... 343/703; 343/860; 455/193.1; 455/121
[58] Field of Search ..................................... 343/703, 860, 343/861, 850; 455/193.1, 193.2, 121, 123; G01R 29/10; H01Q 1/50

[56] References Cited

U.S. PATENT DOCUMENTS

| | | | |
|---|---|---|---|
| 5,073,781 | 12/1991 | Stickelbrocks | 342/51 |
| 5,168,282 | 12/1992 | Viereck | 343/745 |
| 5,287,112 | 2/1994 | Schuermann | 342/51 |

*Primary Examiner*—Hoanganh T. Le
*Attorney, Agent, or Firm*—Rebecca Mapstone Lake; Robert D. Marshall; Richard L. Donaldson

[57] ABSTRACT

A static antenna tuning and antenna voltage measurement circuit (40) includes antenna voltage conversion circuitry (44) for converting a voltage signal (42) to a measurement signal representative of transmitter/receiver antenna (16) operation. Voltage signal (42) arises from transmitter/receiver antenna (16) transmitting or receiving a recognition signal (S1, S2). Comparator circuitry (48, 50, 52) compares the measurement signal to a predetermined optimal transmitter/receiver antenna operation signal. Control circuitry (54, 56) controls the tuning of transmitter/receiver antenna (16) such that (a) in the event that the measurement signal indicates optimal performance of transmitter/receiver antenna (16) relative to the predetermined optimal transmitter/receiver antenna operation signal, storing the measurement signal as the predetermined optimal transmitter/receiver antenna operation signal; (b) in the event that the measurement signal indicates less than optimal performance of transmitter/receiver antenna (16), generating a tuning signal to antenna tuning circuitry (56) associated with transmitter/receiver antenna (16); and (c) repeating steps (a) and (b) until an optimal transmitter/receiver antenna performance condition exists.

20 Claims, 1 Drawing Sheet

5,856,809

STATIC ANTENNA TUNING AND ANTENNA VOLTAGE MEASUREMENT

TECHNICAL FIELD OF THE INVENTION

The present invention relates to an improved static antenna tuning and antenna voltage measurement apparatus for a recognition system, and, more particularly, to an improved static antenna tuning and antenna voltage measurement apparatus for a recognition system, which system is usable in conjunction with an ignition switch or similar control mechanism for a vehicle or other facility, and which static antenna tuning and antenna voltage measurement apparatus provides controlled static antenna tuning and voltage measurement during normal recognition system operation without any equipment handling or manual operation by an operator.

BACKGROUND OF THE INVENTION

Various types of recognition systems are taught by the following commonly assigned U.S. Patents and Applications: U.S. Pat. Nos. 5,287,112; 5,270,717; 5,196,735; 5,170,493; 5,168,282; 5,126,745; 5,073,781; 5,053,774; 5,025,492; U.S. Ser. No. 08/021,123, filed Feb. 23, 1993 [TI-17529]; Ser. No. 08/065,286, filed May 21, 1993 [TI-16981]; and Ser. No. 08/086,786, filed Jul. 2, 1993 [TI-17507]. Systems conforming to the teachings of the foregoing documents are marketed under the name TIRIS ("Texas Instruments Register and Identification System"). A recognition system similar in result to, but structurally and functionally specifically different from, TIRIS is disclosed in U.S. Pat. No. 4,918,955. Other types of recognition systems include systems known as AVI (for "Automatic Vehicular Identification"), as taught, for example, by commonly assigned U.S. Pat. No. 5,287,112 and commonly assigned U.S. application Ser. No. 08/021,123, filed Feb. 23, 1993.

In one type of TIRIS recognition system of interest, a transmitter/receiver (also referred to herein, in the claims hereof and elsewhere as an "interrogator" or a "reader") selectively radiates energy via an associated first antenna. The energy is radiated from the vicinity of a key-operated lock, such as a vehicle ignition switch. The radiated energy is often referred to as an "interrogation signal." The radiated energy is received by a second antenna present on or in a key. The key also includes facilities, such as circuitry (sometimes called a "transponder" or "tag"), connected to the second antenna. An electrical signal produced or induced in the key's circuitry by the received energy either is affected (e.g., increased or decreased) by the circuitry or effects the generation of a stored, uniquely coded signal by the circuitry. The affected or coded signal is often referred to as a "recognition signal."

Depending on the constituents of the key's circuitry, either the recognition signal is transmitted or reflected back to the transmitter/receiver via the second and first inductors or antennas. A key "matching" the particular ignition switch transmits or causes a predetermined recognition signal. Other keys which operate other ignition switches associated with similar recognition systems may similarly respond to the interrogation signal but transmit recognition signals different from the predetermined recognition signal.

The transmitter/receiver includes facilities which analyze the recognition signals received thereat to determine if the analyzed signal is the predetermined recognition signal produced by the matching key. If the analyzed signal is the predetermined recognition signal, the concurrence of such predetermined recognition signal and the operation of the ignition switch by the matching key starts the engine of the vehicle. If the analyzed signal is not the predetermined recognition signal, either the ignition switch cannot be operated by the key, or, if it can be operated, such operation is ineffective to start the engine.

Portability and/or space limitations usually result in the transmitter/receiver of a TIRIS-type of recognition system being not very powerful. Also, the recognition signals, that is the signals transmitted or reflected back to the transmitter/receiver from the key-included circuitry, may be derived from the limited energy radiated from the transmitter/receiver, not from energy derived from a key-contained power source, such as a battery, as is typical in systems of the AVI type. While the use of a battery with key-included circuitry of a TIRIS system is technically possible, the large size and resulting unwieldiness of the resulting key would probably lead to rejection by users. As a consequence of the foregoing, it is critical that circuit efficiencies be as high as possible.

One type of recognition circuitry of the subject type includes active and passive components, which in response to the receipt of energy from the transmitter/receiver produce a coded signal. See the above-noted commonly assigned U.S Patents and Applications. The coded signal, which may be produced by data stored in memory, is transmitted back to the transmitter/receiver, where comparison with the stored "matching" signal is carried out. The coded signal may be produced by modulating a carrier with the stored code, and the carrier may be, or may be derived from, the energy received by the key-included facilities from the transmitter/receiver. In this latter event, the system may be of the TIRIS variety, and the key and its circuitry require no on-board power source and may be said to be "battery-less." This third type of system may also be of the AVI variety, in which case the transponder is typically powered by a self-contained power source.

Recognition systems of the above type may be the full-duplex variety. Specifically, the transmitter/receiver may simultaneously operate as both a transmitter and a receiver, that is, it may simultaneously radiate energy to the key-included circuitry and receive for analysis the corresponding signal produced by such circuitry. Typically, in full-duplex operation, the frequency of the modulated carrier radiated by the transmitter/receiver to the key-included circuitry is different from the frequency of the modulated carrier produced by the key-included circuitry and thereafter received and analyzed by the receiver/transmitter. See above-noted commonly assigned application Ser. No. 08/012,123 [TI-17529].

In both the full-duplex and half-duplex recognition systems, an important consideration is proper operation of the transmitter/receiver antenna. For proper operation, it is important that the antenna be properly tuned. Conventional antenna tuning mechanisms and methods require that the antenna be manually tuned. This can be a laborious and sometimes impractical process.

In addition, with conventional recognition systems, there is the need for a measuring device that measures the antenna voltage to maintain and control the resonance circuit voltage for proper operation of the transmit/receive antenna. This measurement is subject to its own limitations, such as inaccuracies and the basic difficulty of taking the antenna voltage measurement.

SUMMARY OF THE INVENTION

There is a need, in light of the above limitations, for a circuit and method of operation that provides both a way of automatically tuning the recognition system antenna and of maintaining and controlling the resonance circuit voltage.

The present invention overcomes foregoing disadvantages and satisfies the identified needs by providing an improved static antenna tuning and antenna voltage measurement apparatus that provides microprocessor controlled antenna-resonance-circuit tuning and antenna voltage measuring during normal operation without measuring devices.

The improved static antenna tuning and antenna voltage measurement apparatus is used with a recognition system that is usable in conjunction with an ignition system or similar control mechanism for a vehicle or other facility.

According to one aspect of the invention, there is provided a static antenna tuning and antenna voltage measurement circuit that includes antenna voltage conversion circuitry for converting a voltage signal to a measurement signal representative of transmitter/receiver antenna operation. A voltage signal arises from transmitter/receiver antenna transmitting or receiving a recognition signal. Comparator circuitry compares the measurement signal to a predetermined optimal transmitter/receiver antenna operation signal. Control circuitry controls the tuning of transmitter/receiver antenna such that (a) in the event that the measurement signal indicates optimal performance of transmitter/receiver antenna relative to the predetermined optimal transmitter/receiver antenna operation signal, storing the measurement signal as the predetermined optimal transmitter/receiver antenna operation signal; (b) in the event that the measurement signal indicates less than optimal performance of transmitter/receiver antenna, generating a tuning signal to antenna tuning circuitry associated with transmitter/receiver antenna; and (c) repeating steps (a) and (b) until an optimal transmitter/receiver antenna performance condition exists.

A technical advantage of the present invention is that it enables the user to tune (or detune) and measure the antenna resonance circuit at all times by using only a software command. This effectively eliminates the need for manual antenna tuning by using the automatic static antenna tuning and voltage measurement circuit of the present invention.

The present invention converts the analog antenna voltage in a digital processable signal, using a voltage/frequency converter. The result is a voltage-proportional frequency that digital circuitry of the present invention processes as a control signal input for controlling the tuning of the transmit/receive antenna. This process occurs continually to provide in real time an optimal performance level from the recognition system transmit/receive antenna.

BRIEF DESCRIPTION OF THE DRAWINGS

The invention in its mode of use and advantages are best understood by reference to the following description of illustrative embodiments when read in conjunction with the accompanying generalized, schematic drawings, wherein.

DETAILED DESCRIPTION OF THE INVENTION

Figure 1A:
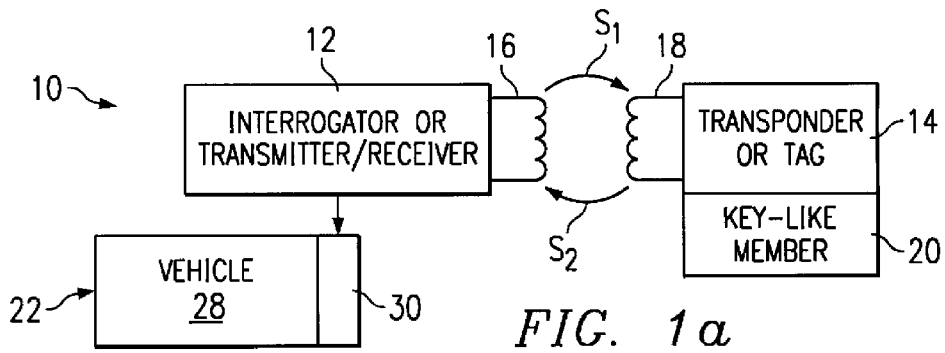
FIGS. 1a and 1b are generalized depictions of recognition systems that may employ the novel concepts of the present invention.
Figure 1B:
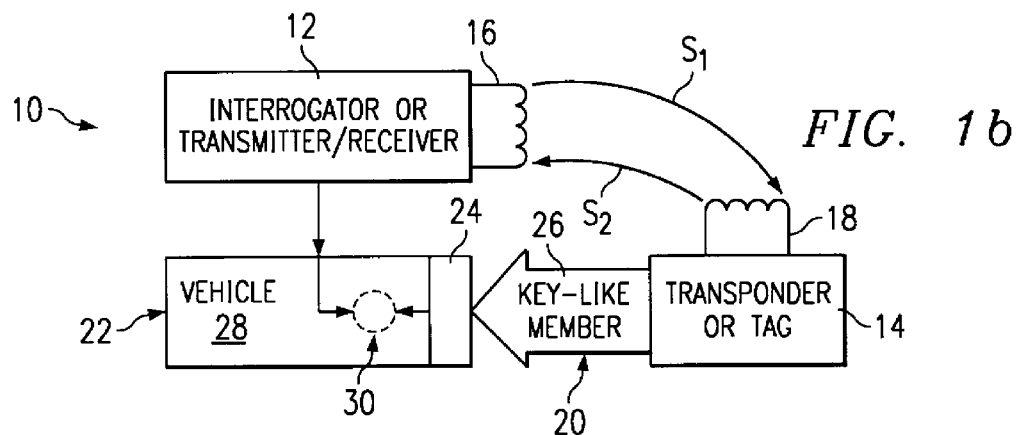

FIGS. 1a and 1b generally illustrate recognition systems 10 that may employ the novel concepts of the present invention. Referring first to FIG. 1a, such systems include transmitter/receiver 12, often called an interrogator or a reader, and transponder 14, sometimes referred to as a tag. Interrogator 12 is a portable or stationary unit which is capable of both transmitting and receiving energy via antenna 16. Transponder 14, which may be self-powered or "batteryless," is capable of receiving energy via an included antenna 18 and, as a consequence thereof, can affect transmitter receiver 12 or transmit energy thereto via antenna 18. Transponder 14 is usually portable and is typically associated with or attached to key-like member 20 which may require identification, counting, routing, sorting or the like.

In typical use, interrogator 12 transmits either continuously or selectively, interrogation signals, in the form of electromagnetic energy, such as radiofrequency (RF) energy, having predetermined characteristics. Selective operation may be initiated manually by a user who perceives the key-like member 20 and who wishes to identify count, route or sort signals from key-like member 20. Selective operation may also be initiated by key-like member 20 being proximate to or moving past interrogator 12. Transponder 14, which associates with or mounts to key-like member 20 may either "match" or not "match" interrogator 12. If transponder 14 matches, the appropriate key-like member 20 is intended to be identified and counted, routed, sorted, or the like. If transponder 14 does not match, the appropriate key-like member is not intended to be identified, counted, routed, sorted, or the like.

A matching transponder 14 receives the interrogation signal via associated antennas 18 and return a predetermined recognition signal, that is, to either affect interrogator 12 in a predetermined fashion or transmit thereto a signal which is coded in a predetermined manner. A non-matching transponders 14 either does not react at all to the received energy or responds with other than the predetermined recognition signal. The interrogation signal and its related energy that are transmitted by the interrogator 12 and received by the transponder 14 are denoted S1. The recognition signal and its related energy, or the returned signal which produces the recognition signal in response to the interrogation signal S1, are denoted S2.

Systems 10 of the type described in the foregoing paragraphs may be of the TIRIS variety and may include transponder 14 which may be batteryless, that is, may include no on-board power supply. The circuitry of these types of transponders 14 is powered by the energy in the recognition signal S1 received from the interrogator 12 via the antennas 16, 18. In this way transponder 14 may be made extremely small. Indeed, a transponder 14 of the batteryless type may be often subcutaneously implanted in livestock for purposes of later identification or counting.

The transponders 14 of any of the above systems 10 may, at the expense of smallness in size, be powered by an on-board power source. In AVI systems 10 the transponders 14 are carried within vehicles 22. In response to interrogation signal S1 transmitted to a moving vehicle at a selected site, such as a toll booth, such transponders 14 respond with signal S2 which informs interrogator 12 of the identity of vehicle 22. This information is used, in turn, to record the fact that a toll is owed in device 22, with a bill being later sent.

In systems 10 of the AVI type, the signals S1 and S2 need to be relatively strong because of the typical high separation between the interrogator 12 and the transponder 14. In other recognition systems 10, especially those that are batteryless, the signals S1 and S2 are relatively weaker. In either event, it is desirable for transponder 14 to efficiently effect the proper transmission and reception of the signals S1 and S2.

A variation of the above system 10 is illustrated in FIG. 1b, which is similar to the system of FIG. 1a except that the device 22 is associated with a control mechanism 24 and transponder 14 is associated with key5 like member 26 for control mechanism 24. In a specific example of this type of system 10, which serves an anti-theft function, the device 22 may be vehicle 28, control mechanism 24 may be an ignition switch which includes a key-operable lock, and key-like member 26 may be a key or other operating member. Transponder 14 may be of the miniature, batteryless variety and is preferably embedded in key-like member 26. The proximity of inductor 18 of transponder 14 in key-like member 26 to antenna 16 of interrogator 12 efficiently couples antennas 16, 18 to permit the above-described transmission and reception of the signals S1 and S2.

Figure 2:
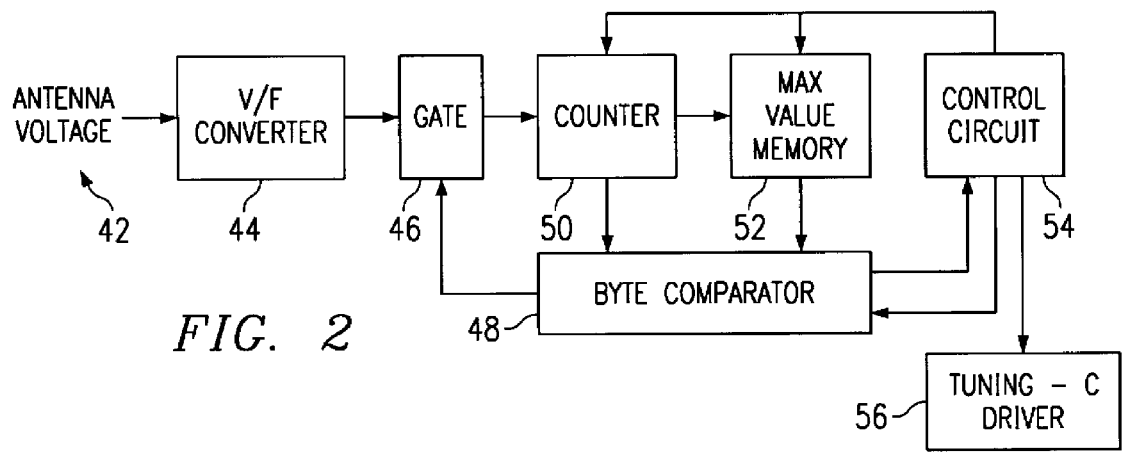
FIG. 2 provides a block diagram of the static antenna tuning and antenna voltage measurement circuitry of the present embodiment.

FIG. 2 provides a block diagram of the static antenna tuning and antenna voltage measurement circuitry 40 of the present invention to illustrate its operation. 20 Note that many of the operations have described as circuit element operations may be performed in software as microprocessor instructions, for example, to be performed by interrogator 12. Accordingly, for the static antenna tuning and voltage measurement of the present invention, interrogator 12 may include the functions here described at FIG. 2.

Referring in particular to FIG. 2, there appears static antenna tuning and antenna voltage measurement circuitry 40 that receives antenna voltage 42 at voltage-to-frequency (V/F) converter 44. The frequency output from V/F converter 44 flows to gate 46. Gate 46 also receives an input from byte comparator 48. Gate 46 sends count information to counter 50. The output of counter 50 goes to both maximum value memory 52 and to byte comparator 48. Control circuit 54 sends control information to counter 50 and maximum value memory 52, in parallel, and control signals to byte comparator 48 and tuning-capacitor driver circuit 56. In addition, byte comparator 48 provides an output signal to control circuit 54.

Antenna tuning and voltage measurement circuitry 40, in essence, provides a microprocessor controlled static antenna tuning mechanism that converts antenna voltage 42, which is an analog voltage signal, into a signal that may be digitally processed. Voltage to frequency converter 44 produces a voltage-proportional frequency that permits both tuning and measuring antenna voltage 42 using only software commands, or electronic circuitry as desired.

In operation, after clearing counter 50, maximum value memory 52 and tuning capacitor driver 56, a declination bit goes from control circuit 54 to counter 50. Then, control circuit 54 outputs the present tuning capacitor bit, N+1, to counter 50. This loads counter 50. Byte comparator 48 then compares the count that counter 50 holds with that held by maximum value memory 52. In the event that the counter 50 count exceeds the count value of maximum value memory 52, maximum value memory stores the count of counter 50. Control circuit 54 then sets the decline bit to zero. On the other hand, if the counter 50 count does not exceed the count value of maximum value memory 52, control circuit 54 sets the decline bit equal to the decline bit +1. Now, in the event that the decline bit exceeds three (3), this means that the maximum antenna tuning position has already been detected. This means that the output tuning function of the present embodiment is complete. If, however, the decline bit does not equal three (3), counter 50 is then reloaded and the above comparison steps repeat until the maximum antenna tuning position is detected. Once the output tuning function is complete, control circuit 54 loads the count value of maximum value memory to tuning-capacitor driver circuit 56.

Figure 3:
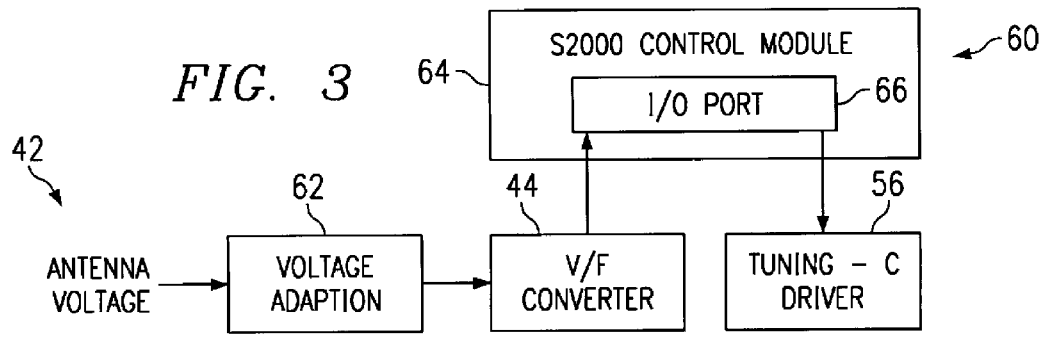
FIG. 3 shows an alternative embodiment of the antenna tuning and voltage measurement circuit of the present invention.

FIG. 3 shows alternative embodiment antenna tuning and voltage measurement circuit 60 that may be programmed with an S2000 control module for a recognition system such as a TIRIS system or AVI system as previously described. In antenna tuning and voltage measurement circuit 60, antenna voltage 42 goes to voltage adaptation circuit 62, which supplies an adapted voltage input to voltage-to-frequency converter 44. The exemplary S2000 control module 64 receives at I/O port 66 the frequency output from voltage-to-frequency converter 44. I/O port 66, provides tuning capacitor driver circuit 56 the desired antenna setting, after S2000 control module performs the operations described in FIG. 2 and accompanying text, above.

As alternative antenna tuning and voltage measurement circuit 60 indicates by using the S2000 I/O ports 66, the operations of (1) gate 46, (2) byte comparator 48, (3) counter 50, (4) maximum value memory 52, and (5) control circuit 54, may all be implemented as software instructions. Consequently, only the voltage-to-frequency converter 44 and tuning capacitor driver 56 functions are performed by hardware components. In the alternative embodiment of FIG. 3, the desired antenna voltage measurement may be obtained readily by calculating the counter value with a converting factor. This may be performed as microprocessor instructions within S2000 control module 64.

In summary, the present embodiments provide a method and system for antenna static tuning and voltage measurement that operates continuously during normal recognition system operation. The present embodiments provide a test of the antenna resonance circuit that tunes the antenna using tuning capacitor driver circuit 56 based on a comparison of the antenna voltage to a previous maximum antenna voltage value. The maximum antenna voltage value indicating the optimal operation of the associated antenna (e.g. antenna 16 of FIG. 1a and 1b). In response to the comparison, control circuit 54 (or S2000 control module 64) generates a control signal to the antenna during capacitor driver circuit 56. The present embodiment achieves its technical advantages without any equipment or manual handling or operation by an operator.

Although the preferred embodiment has been described in detail, it should be understood that various changes, substitutions and alterations may be made herein without departing from the spirit and scope of the invention as defined in the dependent claims.

What is claimed is:

1. An improved antenna tuning apparatus for a transmitter/receiver antenna of a recognition system, said recognition system having an associated matching member which operates with a transponder to control a control mechanism of a device; the matching member and other non-matching members containing facilities each of which, when receiving energy transmitted from said transmitter/receiver antenna produces a respective unique recognition signal in said transponder; control of the device being possible only upon simultaneous occurrence of both operation of the control mechanism and production of a recognition signal by the matching member; wherein the improved static antenna tuning and antenna voltage measurement apparatus comprises:

antenna voltage conversion circuitry for converting a voltage signal to a measurement signal representative of transmitter/receiver antenna operation, said voltage signal arising from said transmitter/receiver antenna transmitting or receiving a recognition signal;

a comparator circuit for comparing said measurement signal to a predetermined optimal transmitter/receiver antenna operation signal; and control circuitry for controlling the tuning of said transmitter/receiver antenna such that: (a) in the event that said measurement signal indicates optimal performance of said transmitter/receiver antenna relative to said predetermine optimal transmitter/receiver antenna signal, storing said measurement signal as said predetermined optimal transmitter/receiver antenna operation signal, (b) in the event that said measurement signal indicates less than optimal performance of said transmitter/receiver antenna, generating a tuning signal to antenna tuning circuitry associated with said transmitter/receiver antenna and (c)repeating steps (a) to and (b) until an optimal transmitter/receiver antenna performance condition exists.

2. The improved static antenna tuning measurement apparatus as in claim 1, wherein said antenna voltage conversion circuitry comprises a voltage-to-frequency conversion circuit.

3. The improved static antenna tuning apparatus as in claim 1, wherein said comparator circuit comprises a gate circuit for generating a count signal representative of the analog voltage values from said transmitter/receiver antenna and a counter for counting said count signal; a maximum value memory for storing said predetermined optimal transmitter/receiver antenna signaland a byte comparator circuit for comparing said connected count signal to said predetermined optimal transmitter/receiver antenna signal.

4. The improved static antenna tuning apparatus as in claim 3, wherein said control circuitry comprises circuitry for generating as control signal to a tuning capacitor driver circuit associated with said transmitter/receiver antenna.

5. The improved static antenna tuning apparatus as in claim 1, wherein said control circuitry comprises a plurality of control instructions associated with a microprocessor for controlling operation of said transmitter/receiver of said recognition system.

6. The improved static antenna tuning apparatus as in claim 1, wherein said control circuitry comprises a counter module for said transmitter/receiver of said recognition system and, further, wherein said antenna voltage conversion circuitry comprises a voltage adaption circuit for generating an adapted voltage and a voltage-to-frequency converter for receiving said adapted voltage and generating a frequency signal representative of said adapted voltage.

7. The improved static antenna tuning voltage measurement apparatus as in claim 1, further comprising circuitry for measuring the analog voltage arising from operation of said antenna transmitter/receiver in a transmit or receive mode of operation.

8. A method for forming an improved antenna tuning apparatus for a transmitter/receiver of a recognition system transmitter/receiver circuit, said recognition system having an associated matching member which operates with a transponder to control a control mechanism of a device; the matching member and other non-matching members containing facilities each of which, when receiving energy transmitted from said transmitter/receiver antenna produces a respective unique recognition signal in said transponder; control of the device being possible only upon simultaneous occurrence of both operation of the control mechanism and production of a recognition signal by the matching member;

wherein the method for forming the improved static antenna tuning apparatus comprises the steps of:

forming an antenna voltage conversion circuitry for converting a voltage signal to a measurement signal representative of transmitter/receiver antenna operation, said voltage signal arising from said transmitter/receiver antenna transmitting or receiving a recognition signal;

forming a comparator circuit for comparing said measurement signal to a predetermined optimal transmitter/receiver antenna operation signal; and forming control circuitry for controlling the tuning of said transmitter/receiver antenna such that: (a) in the event that said measurement signal indicates optimal performance of said transmitter/receiver antenna relative to said predetermine optimal transmitter/receiver antenna signal, storing said measurement signal as said predetermined optimal transmitter/receiver antenna operation signal and (b) in the event that said measurement signal indicates less than optimal performance of said transmitter/receiver antenna, generating a tuning signal to antenna tuning circuitry associated with said transmitter/receiver antenna; and (c)repeating steps (a) and (b) until an optimal transmitter/receiver antenna performance condition exists.

9. The method of claim 8, wherein said antenna voltage conversion circuitry forming step further comprises the step of forming a voltage-to-frequency conversion circuit.

10. The method of claim 8, wherein said comparator circuit forming step further comprises the step of forming a gate circuit for generating a count signal representative of the analog voltage values from said transmitter/receiver antenna and a counter for counting said count signal; a maximum value memory for storing said predetermined optimal transmitter/receiver antenna signaland a byte comparator circuit for comparing said connected count signal to said predetermined optimal transmitter/receiver antenna signal.

11. The method of claim 10, wherein said control circuitry forming step further comprises the step of forming circuitry for generating as control signal to a tuning capacitor driver circuit associated with said transmitter/receiver antenna.

12. The method of claim 8, wherein said control circuitry forming step further comprises the step of forming a plurality of control instructions associated with a microprocessor for controlling operation of said transmitter/receiver of said recognition system.

13. The method of claim 8, wherein said control circuitry forming step further comprises the step of forming a counter module for said transmitter/receiver of said recognition system and, further, wherein said antenna voltage conversion circuitry comprises a voltage adaption circuit for generating an adapted voltage and a voltage-to-frequency converter for receiving said adapted voltage and generating a frequency signal representative of said adapted voltage.

14. The method of claim 8 further comprising the steps of forming circuitry for measuring the analog voltage arising from operation of said antenna transmitter/receiver in a transmit or receive mode of operation.

15. An improved method for tuning a transmitter/receiver antenna of a recognition system transmitter/receiver circuit, said recognition system having an associated matching member which operates with a transponder to control a control mechanism of a device; the matching member and other non-matching members containing facilities each of which, when receiving energy transmitted from said transmitter/receiver antenna produces a respective unique recognition signal in said transponder; control of the device being possible only upon simultaneous occurrence of both operation of the control mechanism and production of a recognition signal by the matching member; wherein the improved static antenna tuning method comprises the steps of:

converting a voltage signal to a measurement signal representative of transmitter/receiver antenna operation, said voltage signal arising from said transmitter/receiver antenna transmitting or receiving a recognition signal;

comparing said measurement signal to a predetermined optimal transmitter/receiver antenna operation signal; and controlling the tuning of said transmitter/receiver antenna such that: (a) in the event that said measurement signal indicates optimal performance of said transmitter/receiver antenna relative to said predetermine optimal transmitter/receiver antenna signal, storing said measurement signal as said predetermined optimal transmitter/receiver antenna operation signal and (b) in the event that said measurement signal indicates less than optimal performance of said transmitter/receiver antenna, generating a tuning signal to antenna tuning circuitry associated with said transmitter/receiver antenna; and (c)repeating steps (a) and (b) until an optimal transmitter/receiver antenna performance condition exists.

16. The method of claim 15, wherein said converting step further comprises the step of converting said voltage signal to a frequency signal representative of transmitter/receiver antenna operation.

17. The method of claim 15 further comprising the steps of generating a count signal representative of the analog voltage values from said transmitter/receiver antenna and a counter for counting said count signal; storing said predetermined optimal transmitter/receiver antenna signal, and comparing said connected count signal to said predetermined optimal transmitter/receiver antenna signal.

18. The method of claim 15, further comprising the steps of generating as control signal to a tuning capacitor driver circuit associated with said transmitter/receiver antenna.

19. The method of claim 15 further comprising the step of controlling operation of said transmitter/receiver of said recognition system using a plurality of control instructions associated with a microprocessor.

20. The method of claim 15 further comprising the steps of generating an adapted voltage representation of said voltage signal and a voltage-to-frequency converter for receiving said adapted voltage, and generating a frequency signal representative of said adapted voltage.

* * * * *